(12) United States Patent
Chen

(10) Patent No.: US 6,649,536 B2
(45) Date of Patent: Nov. 18, 2003

(54) METHOD FOR FABRICATING CAPACITOR OF SEMICONDUCTOR DEVICE

(75) Inventor: Young Il Chen, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 51 days.

(21) Appl. No.: 09/988,710

(22) Filed: Nov. 20, 2001

(65) Prior Publication Data

US 2002/0061622 A1 May 23, 2002

(30) Foreign Application Priority Data

Nov. 22, 2000 (KR) ......................... 2000-69658

(51) Int. Cl.[7] ..................... H01L 21/8242; H01L 21/31; H01L 31/119
(52) U.S. Cl. ..................... 438/770; 438/240; 257/310
(58) Field of Search ................. 438/396, 254, 438/240, 785–788, 770–773; 257/303–310

(56) References Cited

U.S. PATENT DOCUMENTS

| | | | |
|---|---|---|---|
| 4,495,219 A | * | 1/1985 | Kato et al. ..................... 427/82 |
| 4,907,053 A | * | 3/1990 | Ohmi ......................... 357/23.1 |
| 6,133,090 A | | 10/2000 | Hong |
| 6,417,042 B2 | * | 7/2002 | Song et al. .................. 438/240 |

* cited by examiner

Primary Examiner—Caridad Everhart
Assistant Examiner—Calvin Lee
(74) Attorney, Agent, or Firm—Morgan, Lewis & Bockius LLP

(57) ABSTRACT

A method for fabricating a capacitor of a semiconductor device on a semiconductor substrate can includes an insulating film formed on the substrate. A plug is formed in the insulating film, the plug electrically connected with the semiconductor substrate. A lower electrode is formed on the plug and the insulating film adjacent to the plug. A $Ta_2O_5$ film is formed on the lower electrode and the insulating film adjacent to the lower electrode. The $Ta_2O_5$ film is oxidized by flowing oxygen under the ambient of hydrogen gas at a temperature of between about 800° C. and 850° C. An upper electrode is formed on the $Ta_2O_5$ film on the lower electrode and the insulating film adjacent to the lower electrode.

12 Claims, 8 Drawing Sheets

METHOD FOR FABRICATING CAPACITOR OF SEMICONDUCTOR DEVICE

RELATED BACK

The present application claims priority to Korean Patent Application No. P2000-69658 filed on Nov. 22, 2000, the disclosure of which is hereby incorporated into the present application by reference.

FIELD OF INVENTION

The present invention relates to a semiconductor device, and more particularly, to a method for fabricating a capacitor of a semiconductor device that prevents a lower electrode from being oxidized, thereby improving a leakage current characteristic of the device.

BACKGROUND OF THE INVENTION

It is known to densely pack DRAM modules on a semiconductor device to achieve a desired capacitance. However, the size of the DRAM and the area of the capacitor must be reduced to achieve the desired density. A $Ta_2O_5$ film that can obtain high capacitance in a relatively small area can be used as a dielectric film for such a capacitor.

When the $Ta_2O_5$ film is used as the dielectric film, silicon can be used as a lower electrode of the capacitor. However, a doping concentration of the silicon can adversely lower the capacitance of the capacitor.

A capacitor having a metal-insulator-metal (MIM) structure can be used to avoid this disadvantage. In the MIM structure, a lower electrode is formed of a metal. In particular, it is known to form the lower electrode from tungsten (W).

FIGS. 1A to 1E show cross-sectional views of a known method for fabricating a capacitor of a semiconductor device.

As shown in FIG. 1A, a first tetra ethyl ortho silicate (TEOS) film 12 and a first nitride film 13 are sequentially deposited on a semiconductor substrate 11. An oxidation process that uses $O_2$ is performed.

Subsequently, the first nitride film 13 and the first TEOS film 12 are selectively removed by photolithography and etching processes to form a contact hole 14 that exposes a portion of the semiconductor substrate 11.

A second nitride film is deposited on a surface of the semiconductor substrate 11 and then etched back such that the nitride film remains on a sidewall within the contact hole 14 to form nitride film spacers 15.

As shown in FIG. 1B, a polysilicon film is deposited on the entire surface of the semiconductor substrate 11 and into the contact hole 14. The polysilicon film is then etched back to form a plug 16 that is disposed within the contact hole 14.

Subsequently, a second TEOS film 17 is deposited at a predetermined thickness and then selectively removed by the photolithography and etching processes, thereby forming a trench 18 that exposes the plug 16 and a surface of the first nitride film 13 adjacent to the plug 16.

As shown in FIG. 1C, a tungsten film 19 is formed by a sputtering method and a chemical vapor deposition (CVD) method. A surface of the tungsten film 19 formed by the CVD method is very rough.

A third TEOS film 20 and a spin on glass (SOG) film 21 are sequentially deposited into the trench 18. The SOG film 21 and the third TEOS film 20 are selectively removed by an etch-back process to expose a surface of the tungsten film 19 disposed outside of the trench 18.

As shown in FIG. 1D, the exposed tungsten film 19 is removed by a CMP process. The unexposed tungsten film 19 within the trench 18 constitutes a lower electrode 19a.

The remaining SOG film 21 and third TEOS film 20 are removed by a wet etching process.

As shown in FIG. 1E, the second TEOS film 17 is removed by the photolithography and etching processes.

A $Ta_2O_5$ film 22 is deposited on the surface of the semiconductor substrate 11. The $Ta_2O_5$ film 22 is then oxidized by a low temperature ultraviolet (UV)-ozone ($O_3$) process. The process uses light having a wavelength of between about 250 to about 260 nm that is generated by an UV-lamp to irradiate $O_3$ produced by an $O_3$ generator. However, the lower electrode 19a disposed below the $Ta_2O_5$ film 22 is also oxidized by this process. The UV-$O_3$ process is performed at a low temperate to reduce the degree of oxidation of the lower electrode 19a.

A titanium nitride (TiN) film or a tungsten(W) film is used as the metal film for an upper electrode. The tungsten film is selectively removed by the photolithography and etching processes such that the film remains on the $Ta_2O_5$ film 22 disposed on the lower electrode 19a and remains on a region adjacent to the lower electrode 19a to form an upper electrode 23. Thus, a capacitor of a known semiconductor device is fabricated.

FIG. 2 shows the surface of the lower electrode formed of tungsten. The upper portion of the lower electrode 19a was formed by the CVD method. The lower electrode 19a and the $Ta_2O_5$ film were oxidized during the UV-$O_3$ oxidation process. As shown in the figure, the surface of the lower electrode 19a is relatively very rough.

The high surface roughness of the lower electrode 19a results in a relatively high application of an electric field at discreet portions of the electrode. The conventional method for fabricating a capacitor of a semiconductor device results in several disadvantages.

Since both the lower electrode as well as the $Ta_2O_5$ film are oxidized during the oxidation process of the $Ta_2O_5$ film, a leakage current is increased due to a tunneling of electrons, as shown in FIG. 3. Because the UV-$O_3$ process is performed at a low temperature to reduce oxidation of the lower electrode, an oxidation efficiency and therefore electrical characteristics of the $Ta_2O_5$ film are also decreased.

SUMMARY OF THE INVENTION

The invention provides a method for fabricating a capacitor of a semiconductor device on a semiconductor substrate that prevents a lower electrode from being oxidized, thereby improving a leakage current characteristic of the device. An insulating film can be formed on the semiconductor substrate. A plug can be formed in the insulating film, the plug electrically connected with the semiconductor substrate. A lower electrode can be formed on the plug and the insulating film adjacent to the plug. A $Ta_2O_5$ film can be formed on the lower electrode and the insulating film adjacent to the lower electrode. The $Ta_2O_5$ film can be oxidized by flowing oxygen under the ambient of hydrogen gas at a temperature of between about 800° C. and 850° C. An upper electrode can be formed on the $Ta_2O_5$ film on the lower electrode and the insulating film adjacent to the lower electrode.

Additional advantages and features of the invention will be set forth in part in the description which follows, and in part will become apparent to those having ordinary skill in the art upon examination of the following, and/or can be learned from practice of the invention. The advantages of the invention may be realized and attained as particularly pointed out in the appended claims.

To achieve these and other advantages and in accordance with the purpose of the invention, as embodied and broadly described, a method for fabricating a capacitor of a semiconductor device according to the invention can include the steps of forming an insulating film on a semiconductor substrate; forming a plug electrically connected with the semiconductor substrate through the insulating film; forming a lower electrode on the plug and the insulating film adjacent to the plug; forming a $Ta_2O_5$ film on a surface of the semiconductor substrate; oxidizing the $Ta_2O_5$ film by flowing oxygen under the ambient of hydrogen gas of 800° C. to 850° C.; and forming an upper electrode on the $Ta_2O_5$ film over the lower electrode and a region adjacent to the lower electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention.

DETAILED DESCRIPTION OF THE PREFERRED EMBODIMENT(S)

Reference will now be made in detail to the preferred embodiments of the present invention, examples of which are illustrated in the accompanying drawings.

Figure 1A:
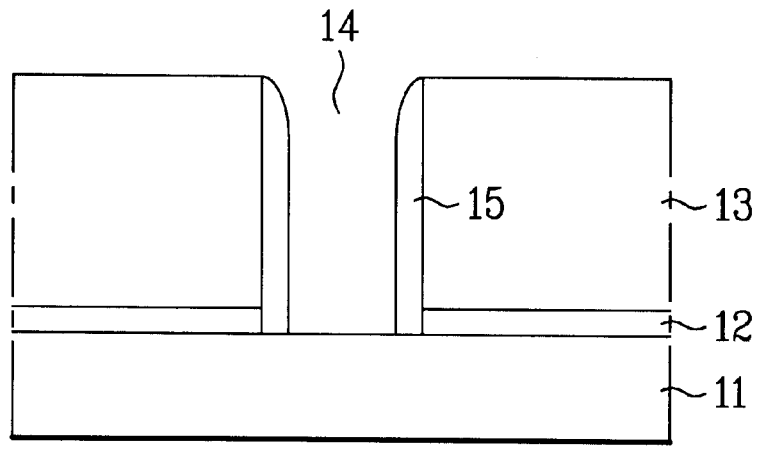
FIGS. 1A to 1E are sectional views of process steps showing a known method for fabricating a capacitor of a semiconductor device.
Figure 1B:
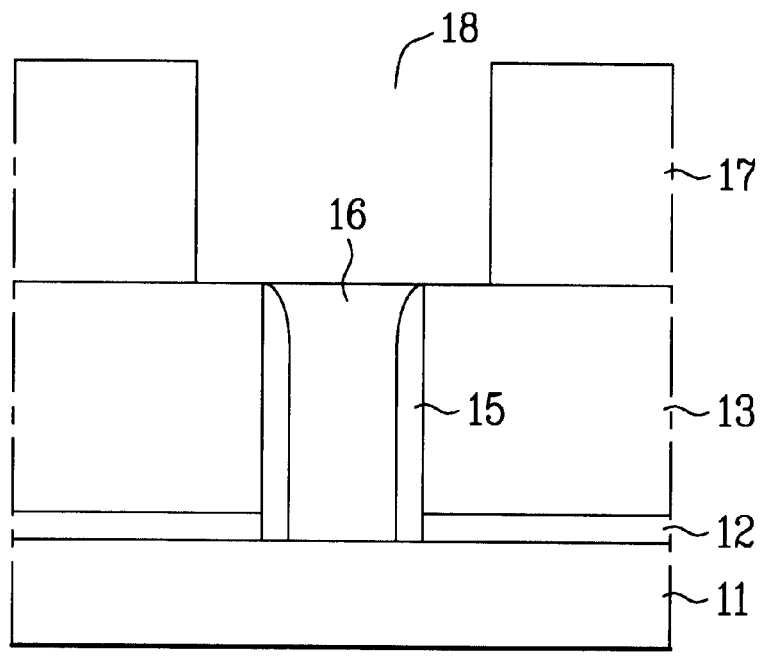
Figure 1C:
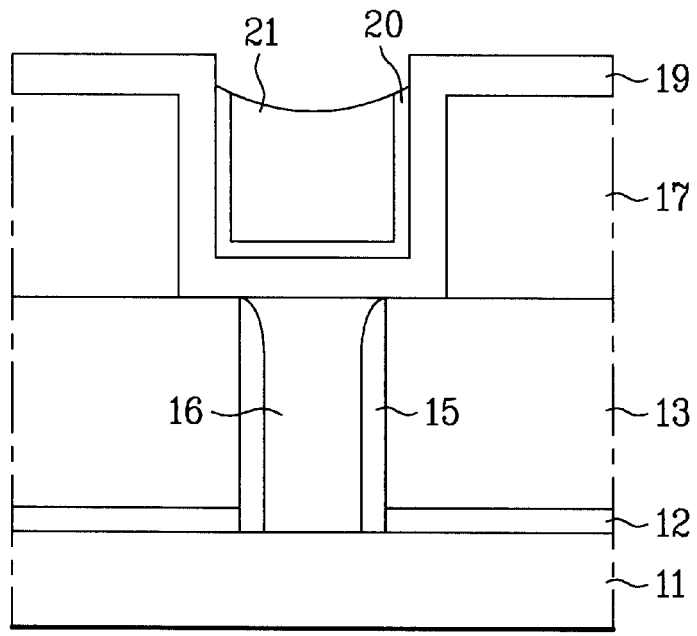
Figure 1D:
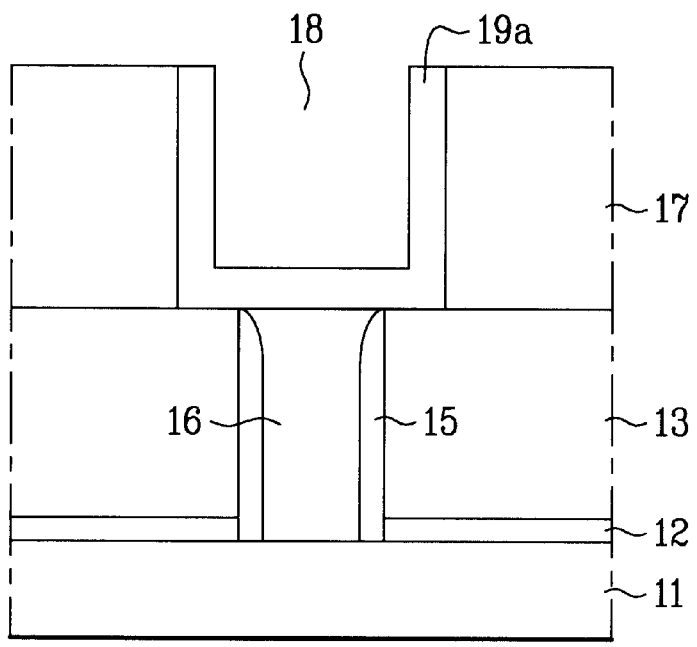
Figure 1E:
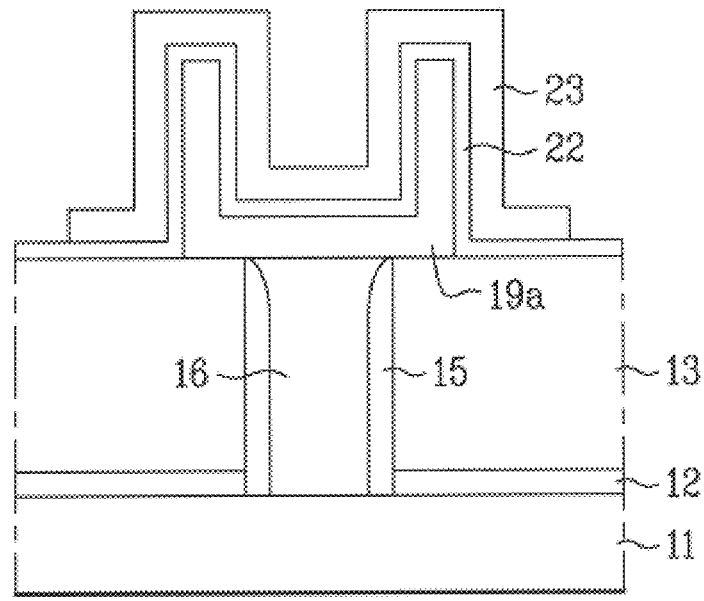
Figure 2:
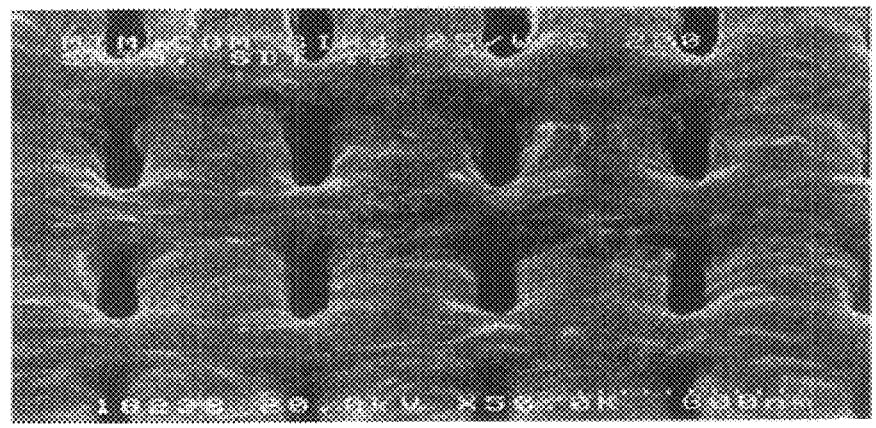
FIG. 2 is a photograph taken of a surface of a lower electrode formed of tungsten.
Figure 3:
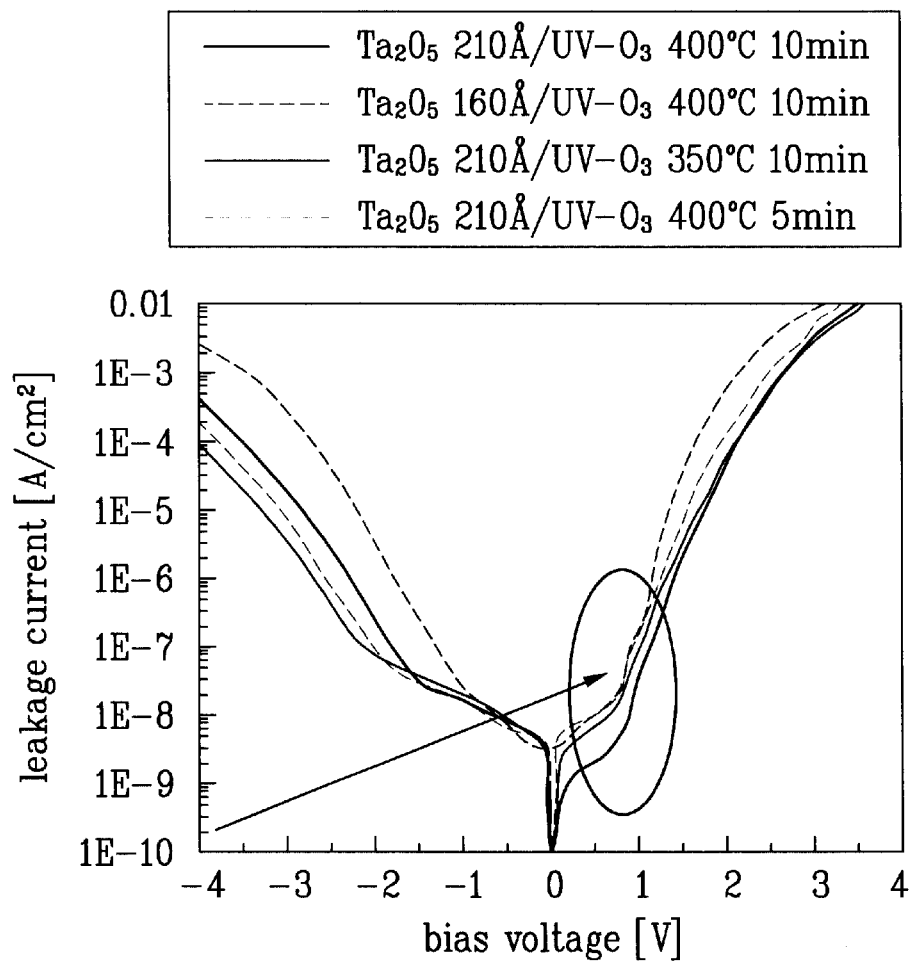
FIG. 3 is a graph showing leakage current depending on a bias voltage of a capacitor of a known semiconductor device.
Figure 4A:
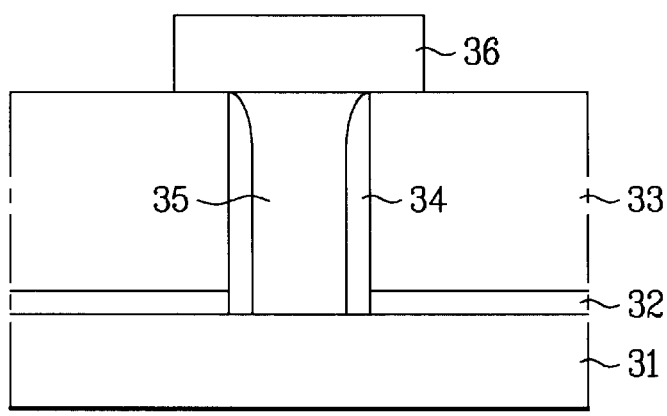
FIGS. 4A and 4B are cross-sectional views of process steps showing a method for fabricating a capacitor of a semiconductor device according to an embodiment of the invention.
Figure 4B:
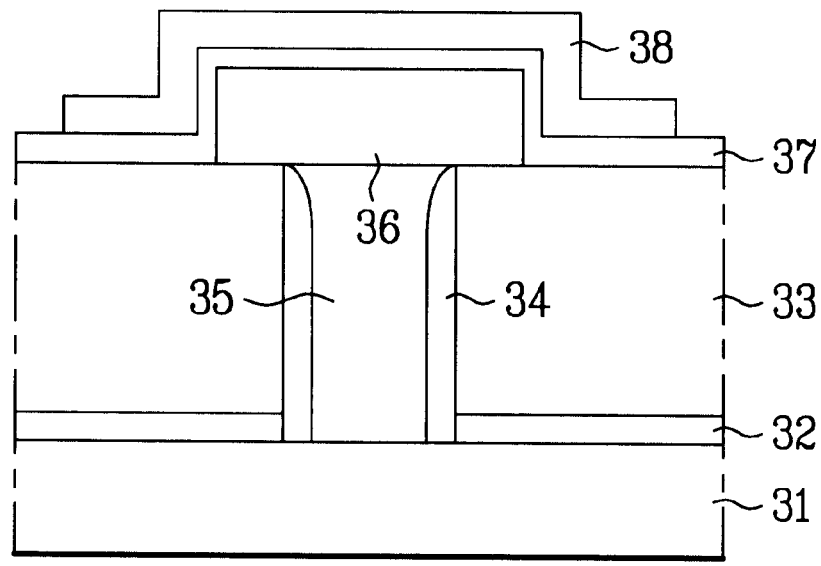

A method for fabricating a capacitor of a semiconductor device according to an embodiment of the invention will be described with reference to FIGS. 4A and 4B.

A TEOS film 32 and a first nitride film 33 can be sequentially deposited on a semiconductor substrate 31. An oxidation process can be performed under the ambient of $O_2$.

Subsequently, the first nitride film 33 and the first TEOS film 32 can be selectively removed by photolithography and etching processes to form a contact hole that exposes a portion of the semiconductor substrate 31.

A second nitride film can be deposited on a surface of the semiconductor substrate 31 and then etched back to form nitride film spacer 34 on a sidewall within the contact hole.

A polysilicon film can be deposited on an entire surface of the semiconductor substrate 31 and in the contact hole. The polysilicon film can be then etched back to form a plug 35 within the contact hole.

Subsequently, a tungsten film can be deposited on the semiconductor substrate 31 by a sputtering method and a CVD method. The tungsten film can be then selectively removed by The photolithography and etching processes, such that the tungsten film remains on the plug 35 and on the first nitride film 33 adjacent to the plug 35. By this method, a lower electrode 36 can be formed.

A $Ta_2O_5$ film 37 can be deposited on the surface of the semiconductor substrate 31 and then oxidized.

Since tungsten can be actively oxidized by a small amount of oxygen at a low temperature, the $Ta_2O_5$ film 37 can be oxidized under the following process conditions to avoid oxidation of the lower electrode 36 that is formed of tungsten.

The $Ta_2O_5$ film 37 can be oxidized by flowing oxygen under the ambient of hydrogen gas at a temperature of between about 800° C. to about 850° C. During the oxidation process, an amount of the hydrogen can be much more than an amount of the oxygen.

The $Ta_2O_5$ film 37 can be reoxidized by an $UV-O_3$ process. The $Ta_2O_5$ film 37 can be irradiated by light having a wavelength of between about 250 to about 260 nm that can be generated by a UV-lamp, within an atmosphere of $O_3$ produced by an $O_3$ generator.

A metal film for an upper electrode can be deposited on the $Ta_2O_5$ film 37. A titanium nitride (TiN) film or a tungsten(W) film can be used as the metal film for an upper electrode.

The metal film for an upper electrode can be selectively removed by the photolithography and etching processes, such that the metal film remains on the $Ta_2O_5$ film 37 on both the lower electrode 36 and a region adjacent to the lower electrode 36. By this process, an upper electrode 38 can be formed. Thus, a capacitor of a semiconductor device according to an embodiment of the invention can be fabricated.

Figure 5A:
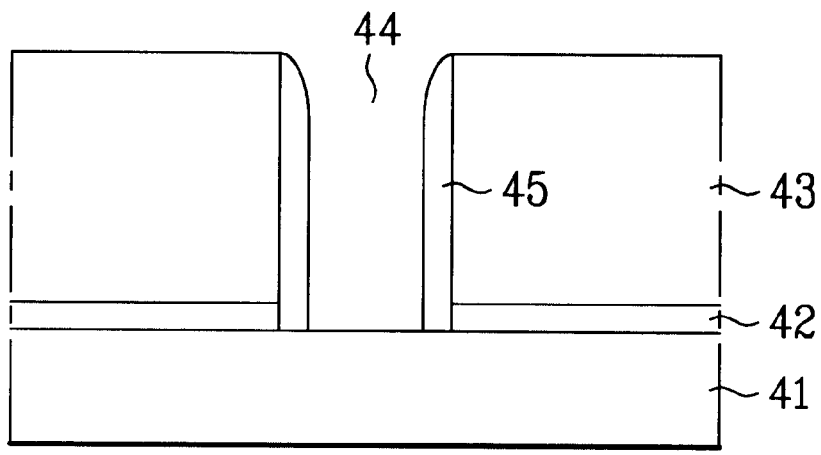
FIGS. 5A to 5F are cross-sectional views of process steps showing a method for fabricating a capacitor of a semiconductor device according to another embodiment of the invention.

As shown in FIG. 5A, a first TEOS film 42 and a first nitride film 43 can be sequentially deposited on a semiconductor substrate 41. An $O_2$-oxidation process can be performed under the ambient of $O_2$.

Subsequently, the first nitride film 43 and the first TEOS film 42 can be selectively removed by photolithography and etching processes to form a contact hole 44 exposing a portion of the semiconductor substrate 41.

A second nitride film can be deposited on a surface of the semiconductor substrate 41 and then etched back such that nitride film spacers 45 can be formed at a side within the contact hole 44.

Figure 5B:
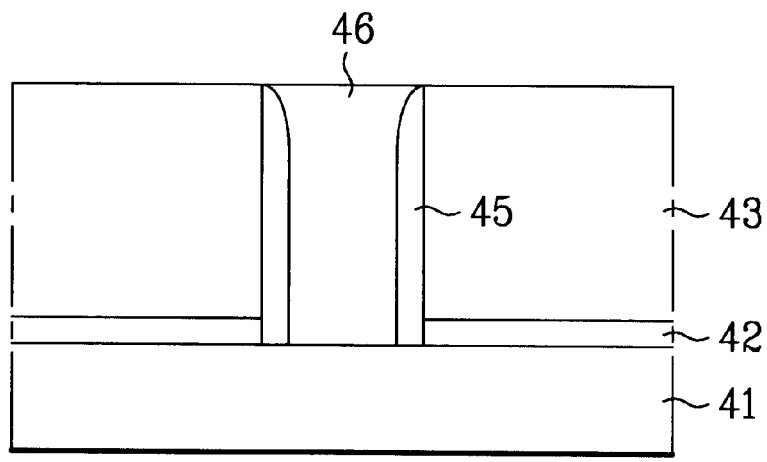

As shown in FIG. 5B, a polysilicon film can be deposited on the semiconductor substrate 41 and in the contact hole 44. The polysilicon film can be then etched back to form a plug 46 within the contact hole 44.

Figure 5C:
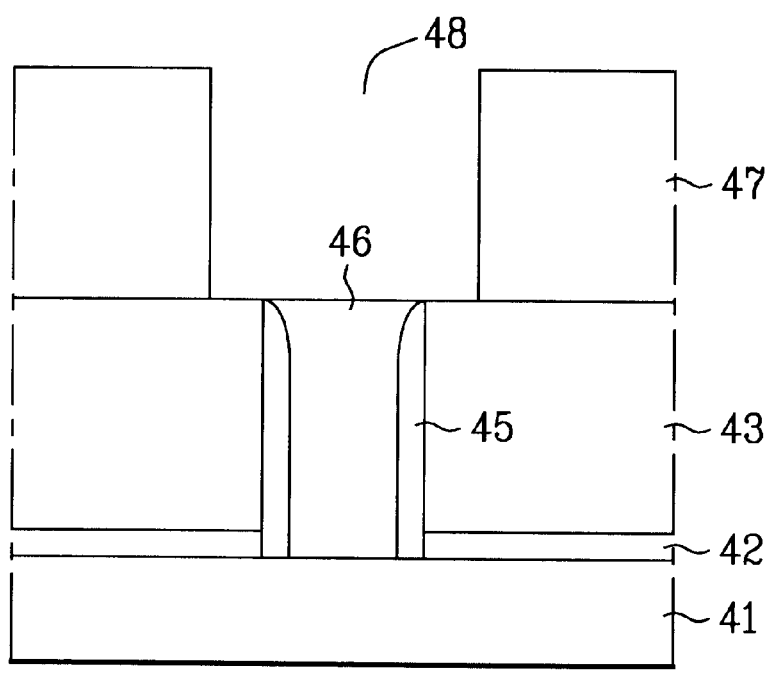

As shown in FIG. 5C, a second TEOS film 47 can be deposited on the semiconductor substrate 41 and than selectively removed by the photolithography and etching processes to form a trench 48 that exposes the plug 46 and a surface of the first nitride film 43 adjacent to the plug 46.

Figure 5D:
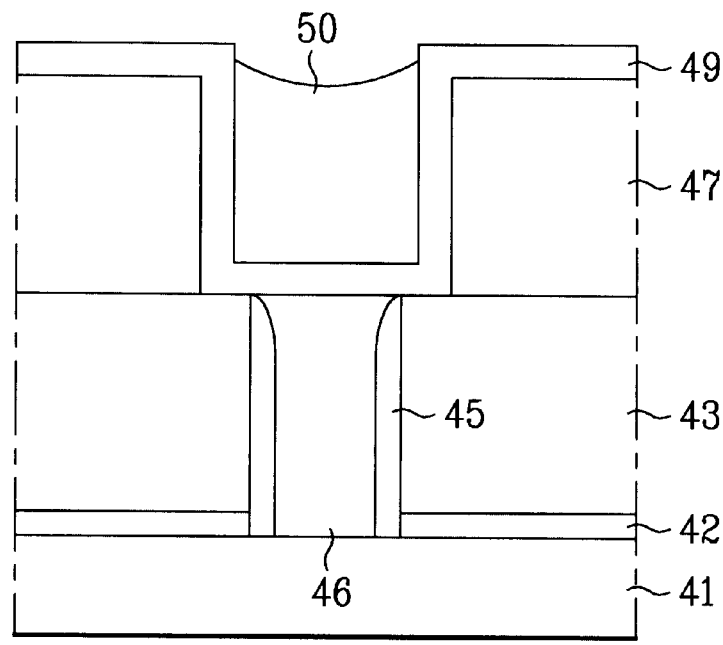

Subsequently, as shown in FIG. 5D, a tungsten film 49 can be formed on the surface of the semiconductor substrate 41 by the sputtering method and the CVD method.

An SOG film 50 can be deposited on the entire surface of the semiconductor substrate 41 and then selectively removed by the etch-back process, such that the film remains within the trench 48. The tungsten film 49 outside the trench 48 can be exposed.

Figure 5E:
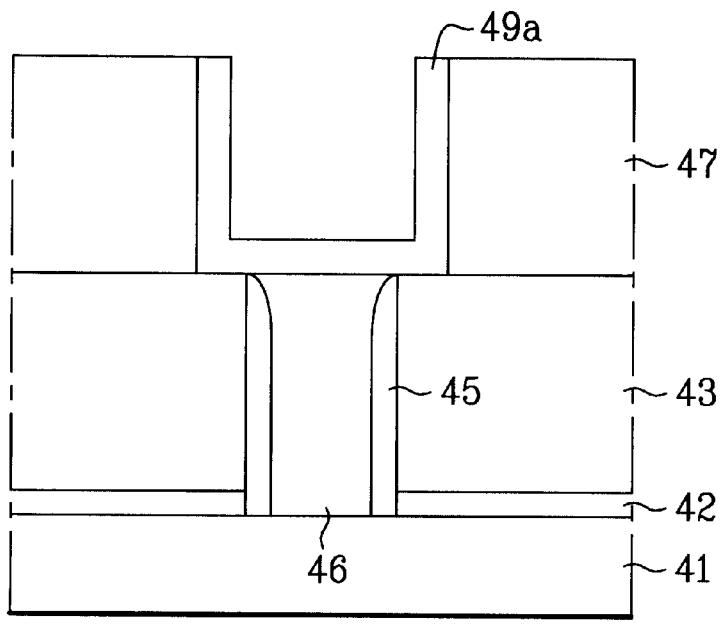

As shown in FIG. 5E, the exposed tungsten film 49 can be removed by the CMP process. The tungsten film 49 remaining within the trench 48 constitutes a lower electrode 49a.

Subsequently, the remaining SOG film 50 can be removed by the wet etching process.

Figure 5F:
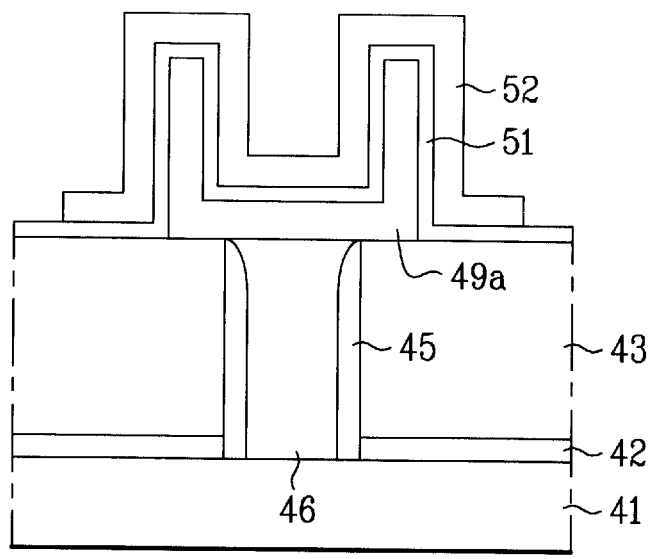

As shown in FIG. 5F, the second TEOS film 47 can be removed, and a $Ta_2O_5$ film 51 can be deposited on the surface of the semiconductor substrate 41. The $Ta_2O_5$ film 51 can be then oxidized by flowing oxygen under the ambient of hydrogen gas at a temperature of between about 800° C. and about 850° C. During the oxidation process, an amount of the hydrogen can be greater than or equal to the amount of the oxygen.

The $Ta_2O_5$ film 51 can be re-oxidized by an $UV-O_3$ process. The $Ta_2O_5$ film 51 can be irradiated by light having a wavelength of between about 250 to about 260 nm that can be generated by a UV-lamp, in an atmosphere of $O_3$ produced by an $O_3$ generator.

A metal film for an upper electrode can be deposited on the entire surface of the $Ta_2O_5$ film 51. A titanium nitride (TiN) film or a tungsten(W) film can be used as the metal film for an upper electrode.

The metal film for the upper electrode can be selectively removed by the photolithography and etching processes, such that the metal film remains on the $Ta_2O_5$ film 51 on both the lower electrode 49a and a region adjacent to the lower electrode 49a. By this process, an upper electrode 52 can be formed. Thus, a capacitor of a semiconductor device according to another embodiment of the invention can be fabricated.

Figure 6:
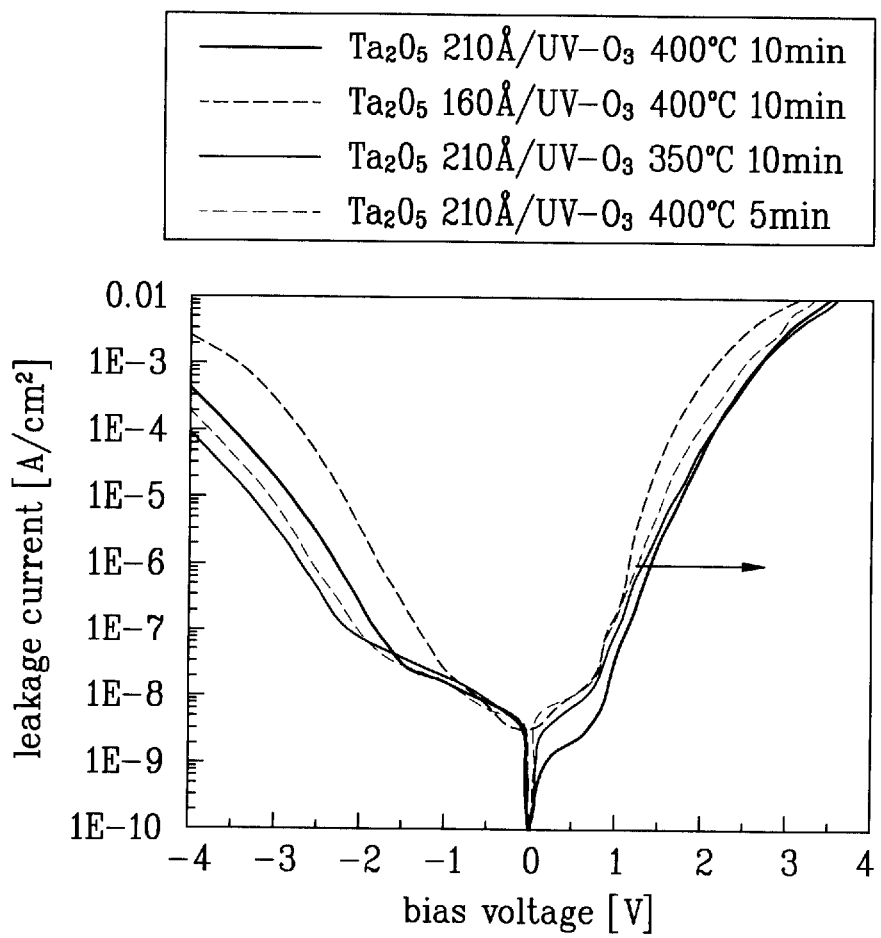
FIG. 6 is a graph showing leakage current depending on a bias voltage of a capacitor of a semiconductor device according to the invention.

As shown in FIG. 6, a leakage current at an operational voltage of the device is decreased as compared to a leakage current for a semiconductor fabricated from a known method.

The methods for fabricating a capacitor of a semiconductor substrate according to the invention have the following advantages.

Since the $Ta_2O_5$ film can be oxidized at a relatively high temperature, the efficiency of the oxidation process can be improved. Thus, the electrical characteristics of the $Ta_2O_5$ film are improved. Further, because oxidation of the lower electrode can be prevented, the leakage current characteristics of the electrode are improved.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications and variations will be apparent to those skilled in the art. In the claims, means-plus-function clauses are intended to cover the structures described herein as performing the recited function and not only structure equivalents but also equivalent structures.

What is claimed is:

1. A method for fabricating a capacitor of a semiconductor device on a semiconductor substrate, comprising:

forming an insulating film on the semiconductor substrate;

forming a plug in the insulating film, the plug electrically connected with the semiconductor substrate;

forming a lower electrode on the plug and the insulating film adjacent to the plug;

forming a $Ta_2O_5$ film on the lower electrode and the insulating film adjacent to the lower electrode;

oxidizing the $Ta_2O_5$ film by flowing oxygen under the ambient of hydrogen gas at a temperature of between about 800° C. and about 850° C.;

re-oxidizing the oxidized $Ta_2O_5$ film by $UV-O_3$ process; and forming an upper electrode on the $Ta_2O_5$ film on the lower electrode and the insulating film adjacent to the lower electrode.

2. The method according to claim 1, wherein forming the insulating film includes forming a TEOS film and a nitride film.

3. The method according to claim 1, further comprising: oxidizing the insulating film under the ambient of $O_2$.

4. The method according to claim 1, wherein forming the plug further comprises:

selectively removing the insulating film by photolithography and etching processes to form a contact hole exposing a portion of the semiconductor substrate;

depositing a polysilicon film on a surface of the insulating film and the contact hole; and selectively removing a portion of the polysilicon film such that the polysilicon film remains in the contact hole.

5. The method according to claim 1, wherein forming the lower electrode further includes depositing a metal film on the insulating film and the plug, and selectively removing a portion of the metal film by photolithography and etching processes such that the metal film remains on the plug and the insulating film adjacent to the plug.

6. The method according to claim 5, wherein the metal film comprises a tungsten film.

7. The method according to claim 1, wherein forming the upper electrode further comprises:

depositing a metal film on the $Ta_2O_5$ film; and selectively removing the metal film by photolithography and etching processes such that the metal film remains on the $Ta_2O_5$ film.

8. The method according to claim 7, wherein the metal film comprises at least one of a titanium nitride (TiN) film and a tungsten(W) film.

9. The method according to claim 1, further comprising: selectively removing a second insulating film to form insulating film spacers.

10. The method according to claim 9, wherein the second insulating film comprises a nitride film.

11. The method according to claim 1, wherein re-oxidizing further includes irradiating light to form $O_3$, and exciting light to form $O_3$.

12. The method according to claim 11, wherein the light has a wavelength of between about 250 nm to about 260 nm.

* * * * *